United States Patent [19]

Shimada et al.

[11] Patent Number: 5,438,299
[45] Date of Patent: Aug. 1, 1995

[54] PHASE-LOCKED LOOP CIRCUIT

[75] Inventors: Toshizi Shimada; Yasunori Kanai, both of Nagano; Yoshio Watanabe, Kawasaki, all of Japan

[73] Assignees: Shinko Electric Industries, Co., Ltd., Nagano; Fujitsu Limited, Kawasaki, both of Japan

[21] Appl. No.: 220,057

[22] Filed: Mar. 30, 1994

[30] Foreign Application Priority Data

Mar. 31, 1993 [JP] Japan .................................. 5-073834

[51] Int. Cl.⁶ .................... H03L 7/08; H03L 7/085; H03L 7/089; H03L 7/099
[52] U.S. Cl. .................................. 331/1 A; 331/17; 331/25; 331/34; 331/8; 331/113 R; 331/177 R; 360/51; 375/376
[58] Field of Search ............... 331/1 A, 10, 11, 12, 331/15, 17, 23, 25, 34, 57, 113 R, 143, 144, 145, 153, 175, 176, 177 R, 8; 360/29, 36.1, 36.2, 41, 51, 52; 375/120

[56] References Cited

U.S. PATENT DOCUMENTS

5,105,169  4/1992  Yamazaki et al. ............ 331/177 RX
5,164,966 11/1992  Hershberger ...................... 331/11 X
5,175,884 12/1992  Suarez ............................ 331/177 RX Primary Examiner—David Mis
Attorney, Agent, or Firm—Staas & Halsey

[57] ABSTRACT

A PLL circuit comprising a phase comparator unit which forms a differentiation signal based upon both edges of an external signal, outputs an early pulse only during a period in which the differentiation signal is overlapped on a period from the leading edge to the trailing edge of a reference signal, and outputs a late pulse only during a period in which the differentiation signal is overlapped on a period from the trailing edge to the leading edge thereof, a charge pump unit which calculates and compares the amounts of integration of the early pulse and the late pulse, lowers the output voltage when the amount of the late pulse is larger than the amount of the early pulse and raises the output voltage when it is smaller, and a VCO which outputs a corrected reference signal of which the frequency decreases or increases accompanying the increase or decrease in the output voltage of the charge pump unit, wherein the VCO is controlled by the output voltage of the charge pump unit and by the early pulse and the late pulse, and works to raise the oscillation frequency when the late pulse is longer than the early pulse and to lower the oscillation frequency when it is shorter.

14 Claims, 4 Drawing Sheets

PHASE-LOCKED LOOP CIRCUIT

BACKGROUND OF THE INVENTION

1. Field of the Invention

The present invention relates to a PLL circuit and, particularly, to a PLL circuit mounted on a chip that is used for a high-speed digital transmission device and like devices.

2. Description of the Related Art

A conventional PLL circuit has been constituted by a phase comparator unit, a charge pump unit and a VCO. When the frequency of a reference signal output from the VCO of the PLL circuit changes due to a change in the temperature, etc. causing the phase of the reference signal to be greatly deviated from the phase of an external signal, the VCO in the PLL circuit, as is widely known, is controlled by a late pulse and an early pulse output from the phase comparator unit, and increases or decreases the frequency of the reference signal, so that the reference signal is adjusted to establish a predetermined phase relationship with the external signal.

However, the conventional PLL circuit has the following problem. The charge pump unit integrates the early pulse and late pulse that are input to form a voltage for controlling the VCO, causing the response speed of the control loop to be delayed. Furthermore, there exists a state where a late pulse or an early pulse is necessarily output in the opposite direction to cancel the above-mentioned control operation before the reference signal establishes a predetermined phase relationship with respect to the external signal. Therefore, an extended period of time is required before the phase of the reference signal is brought into match with the phase of the external signal.

SUMMARY OF THE INVENTION

The present invention was accomplished in order to solve the above-mentioned problem, and its object is to provide a PLL circuit which is capable of bringing the reference signal into phase with the external signal at a high speed.

According to the present invention, there is provided a PLL circuit, which so controls the phase of a corrected reference signal that the leading edge of a reference signal is located at an intermediate position in a differentiation signal, comprising:

a phase comparator unit which accepts an external signal and a reference signal, forms, based on said external signal, a differentiation signal having a predetermined time width in synchronism with both edges thereof, outputs an early pulse only during a period in which said differentiation signal overlaps a period from the leading edge to the trailing edge of said reference signal, and outputs a late pulse only during a period in which, said differentiation signal overlaps a period from the trailing edge to the leading edge of said reference signal;

a charge pump unit which accepts said early pulse and said late pulse, calculates and compares the amounts of integration of the pulses, lowers the output voltage to become smaller than the present output voltage when the amount of integration of the late pulse is larger than the amount of integration of the early pulse, and raises the output voltage to become larger than the present output voltage when the amount of integration of the late pulse is smaller than the amount of integration of the early pulse; and a VCO which receives an output voltage from said charge pump unit, and outputs a corrected reference signal of the frequency which is lowered to become smaller than the present frequency when said output voltage is raised and the frequency which is raised to become greater than the present frequency when said output voltage is lowered;

wherein said VCO is controlled by the output voltage of said charge pump unit and is further controlled by said early pulse and said late pulse output from said phase comparator unit, and works to raise the oscillation frequency to become higher than the present frequency when the width of the late pulse is larger than the width of the early pulse, and works to lower the oscillation frequency to become lower than the present frequency when the width of the late pulse is smaller than the width of the lead pulse.

According to the present invention, furthermore, there is provided a PLL circuit which so controls the phase of a corrected reference signal that the leading edge of a reference signal is located at an intermediate position in a differentiation signal, comprising:

a phase comparator unit which accepts an external signal and a reference signal, forms, based on said external signal, a differentiation signal having a predetermined time width in synchronism with both edges thereof, outputs an early pulse only during a period in which said differentiation signal overlaps a period from the leading edge to the trailing edge of said reference signal, and outputs a late pulse only during a period in which said differentiation signal overlaps a period from the trailing edge to the leading edge of said reference signal;

a charge pump unit which accepts said early pulse and said late pulse, calculates and compares the amounts of integration of the pulses, lowers or raises the output voltage to become smaller than the present output voltage when the amount of integration of the late pulse is larger than the amount of integration of the early pulse, and raises or lowers the output voltage to become larger than the present output voltage when the amount of integration of the late pulse is smaller than the amount of integration of the early pulse; and a VCO which receives an output voltage from said charge pump unit, and outputs a reference correction signal of which the frequency is lowered to become smaller than the present frequency when said output voltage is raised and of which the frequency is raised or lowered to become greater than the present frequency when said output voltage is lowered or raised;

wherein a corrected pulse generating unit is provided between said phase comparator unit and said charge pump unit, and when said late pulse and said early pulse are input in this order in a period in which said differentiation signal is output from said phase comparator unit, said corrected pulse generating unit outputs a corrected late pulse and a corrected early pulse to said charge pump unit in the order of said late pulse and said early pulse that are input;

when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output; and when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit.

Furthermore, the VCO is controlled by the output voltage of said charge pump unit and is further controlled by said corrected early pulse and said corrected late pulse output from said corrected pulse generating unit, and works to raise the oscillation frequency to become higher than the present frequency when the width of the corrected late pulse is larger than the width of the corrected early pulse, and works to lower the oscillation frequency to become lower than the present frequency when the width of the corrected late pulse is smaller than the width of the corrected early pulse.

According to the present invention as described above, the VCO is controlled by the output voltage of the charge pump unit and by the early pulse and the late pulse output from the phase comparator unit, making it possible to increase the response speed of the control loop.

Moreover, a corrected pulse generating unit is provided between said phase comparator unit and said charge pump unit, and when said late pulse and said early pulse are input in a period in which said differentiation signal is output from said phase comparator unit, said corrected pulse generating unit outputs a corrected late pulse and a corrected early pulse to said charge pump unit in the order of said late pulse and said early pulse that are input and when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output and, further, when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit. It is therefore made possible to delete the late pulse or the early pulse in the direction of canceling the control output of the phase comparator unit until the reference signal establishes a predetermined phase relationship with respect to the external signal and, hence, to quickly bring the phase of the reference signal into match with the phase of the external signal.

Furthermore, the VCO is controlled by the output voltage of the charge pump unit and by the early pulse and the late pulse output from the phase comparator unit, making it possible to increase the response speed of the control loop, to decrease the amount of jittering in the reference signal with respect to the external signal, and to quickly bring the signals into phase.

BRIEF DESCRIPTION OF THE DRAWINGS

The present invention will be more clearly understood from the description as set forth below with reference to the accompanying drawings wherein.

DESCRIPTION OF THE PREFERRED EMBODIMENT

Figure 1:
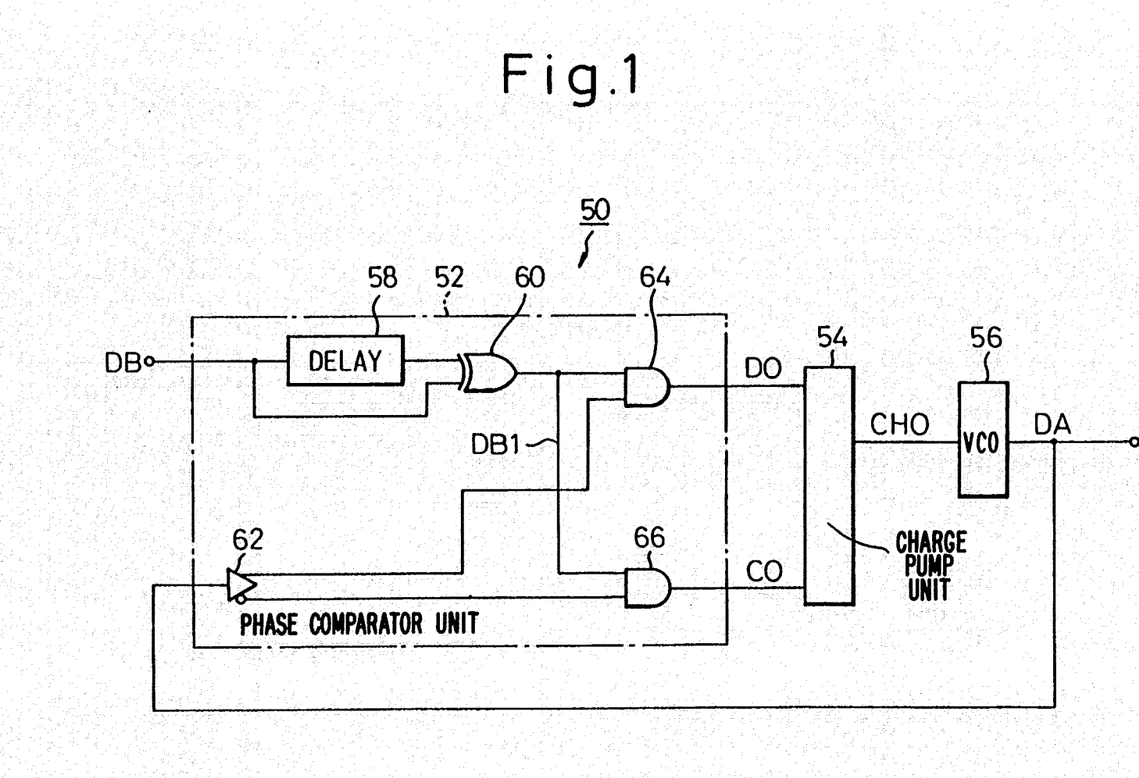
FIG. 1 is a block diagram illustrating a related PLL circuit.

Before describing the preferred embodiment according to the present invention, an example of the related art is mentioned below with reference to FIG. 1 which is a block diagram illustrating the constitution of a related PLL circuit.

The constitution of the related PLL circuit will, first, be described with reference to FIG. 1. The PLL circuit 50 is constituted by a phase comparator unit 52, a charge pump unit 54, and a VCO 56.

In move detail, the phase comparator unit 52 comprises a first delay unit 58 which outputs an input signal after delaying it by a predetermined period of time T1, an EXOR gate 60, a buffer gate 62 for outputting signals of the same polarity and of the inverted polarity based upon a signal that is input, a first AND gate 64 and a second AND gate 66. When an external signal DB and a reference signal DA are input, the phase comparator unit 52 forms through the first delay unit 58 and the EXOR gate 60 a differentiation signal DB1 having a time width T1 based upon the external signal DB in synchronism with a rising edge and a falling edge thereof, and further outputs through the first AND gate 64 and the second AND gate 66 a late pulse CO when the reference signal DA is Lo and outputs an early pulse DO when the reference signal DA is Hi in a period in which a differentiation signal DB1 is being output.

The charge pump 54 receives the late pulse CO and the early pulse DO, calculates and compares the amounts of integration of the pulses, and works to lower the output voltage CHO to become smaller than the present output voltage CHO when the amount of integration of the late pulse CO is larger than the amount of integration of the early pulse DO, and works to raise the output voltage CHO to become larger than the present output voltage CHO when the amount of integration of the late pulse CO is smaller than the amount of integration of the early pulse DO.

The VCO 56 receives the output voltage CHO from the charge pump unit 54, and outputs a corrected reference signal of which the frequency is lowered to become lower than the present frequency when the output voltage CHO is raised and of which the frequency is raised to become higher than the present frequency when the output voltage CHO is lowered (the corrected reference signal is fed back to the phase comparator unit 52, and is, hereinafter, referred to as reference signal DA).

When the external signal DB and the reference signal DA having a period nearly the same as a pulse of the external signal DB are input to the PLL circuit that is constituted as described above, the phase of the rising edge of the reference signal DA is so controlled as to be located at nearly an intermediate position of the differential signal DB1 and, whereby the phase of the reference signal DA becomes nearly the same as the phase of the external signal DB. An outline of this operation will be described below.

First, when the rising edge of the reference signal DA is earlier than the intermediate position in a period in which the differentiation signal DB1 is output, the output amount of the early pulse DO becomes greater than the output amount of the late pulse CO, and the amount of integration of the early pulse DO becomes greater. Therefore, the output voltage CHO of the charge pump unit 54 increases to become greater than the present voltage and, hence, the frequency of the reference signal DA output by the VCO 56 decreases to become lower than the frequency of before being corrected, the period of the reference signal DA becomes longer, the output amount of the late pulse CO increases, and the output amount of the early pulse DO decreases, such that the output amount of the late pulse CO and the output amount of the early pulse DO converge to become nearly equal to each other. That is, the phase of the rising edge of the reference signal DA is so controlled as to be located nearly at an intermediate position in a period in which the differentiation signal DB1 is output.

Next, when the rising edge of the reference signal DA is later than the intermediate position of the differentiation signal DB1, the output amount of the early pulse DO becomes smaller than the output amount of the late pulse CO contrary to the above-mentioned case, and the amount of integration of the late pulse CO becomes greater. Therefore, the output voltage CHO of the charge pump unit 54 decreases to become smaller than the present voltage, the frequency of the reference signal DA output by the VCO 56 increases to become higher than the frequency of before being corrected, the period of the reference signal DA becomes short, the output amount of the early pulse DO increases and the output amount of the late pulse CO decreases, such that the output amount of the late pulse CO and the output amount of the early pulse DO converge to become nearly equal to each other. That is, the phase of the rising edge of the reference signal DA is so controlled as to be located nearly at an intermediate position of the differentiation signal DB1.

However, the above-mentioned PLL circuit has a problem as described below.

When the frequency of a reference signal DA output from the VCO of the PLL circuit changes due to a change in the temperature causing the phase of the reference signal DA to be greatly deviated from the phase of an external signal DB, the VCO is controlled by a late pulse CO and an early pulse DO output from the phase comparator unit, and works to increase or decrease the frequency of the reference signal DA, so that the reference signal DA is converged as to establish a predetermined phase relationship to the external signal DB.

However, since the charge pump unit integrates the early pulse and the late pulse that are input to form a voltage for controlling the VCO, the response speed of the control loop tends to be delayed. Furthermore, there exists a state where a late pulse CO or an early pulse DO is necessarily output in the opposite direction to cancel the above-mentioned control operation before the reference signal DA establishes a predetermined phase relationship with respect to the external signal DB. Therefore, an extended period of time is required before the phase of the reference signal DA is brought into phase with the external signal DB.

A preferred embodiment of the present invention will now be described in detail in conjunction with the accompanying drawings. The same constituent portions as those of the prior art are denoted by the same reference numerals and their description is omitted.

Figure 2:
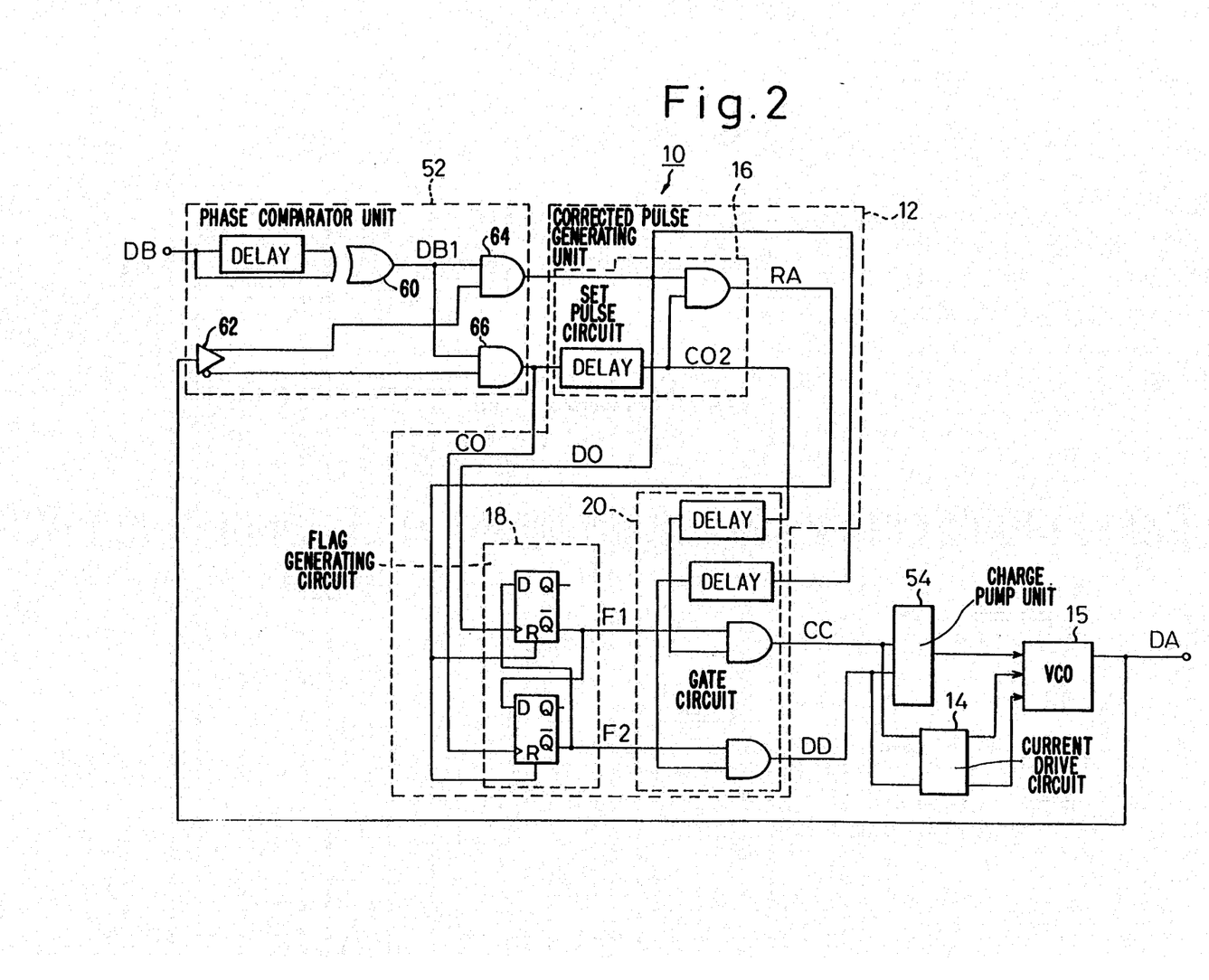
FIG. 2 is a block illustrating the constitution of a PLL circuit according to an embodiment of the present invention.

First, the constitution will be described with reference to FIGS. 2 and 3. A PLL circuit 10 is constituted by a phase comparator unit 52, a corrected pulse generating unit 12, a charge pump unit 54, a current drive circuit 14 and a VCO 15.

In further detail, the corrected pulse generating unit 12 is provided between the phase comparator unit 52 and the charge pump unit 54, and is constituted by a set pulse circuit 16 which generates a set pulse RA of a flag depending upon the logical product of a second late pulse CO2 that is formed by delaying the late pulse CO by a predetermined period of time and the early pulse DO, a flag generating circuit 18 for generating a first flag F1 which is set by a set pulse RA and is reset by the input of the load pulse DO and for generating a second flag F2 which is set by the set pulse RA and is reset by the input of the late pulse CO, and a gate circuit 20 which receives the second late pulse CO2, early pulse DO, first flag F1 and second flag F2, outputs the second late pulse CO2 as a corrected late pulse CC only when the first flag F1 is being set, and outputs the early pulse DO as a corrected early pulse DD only when the second flag F2 is being set. The flag generating circuit 18 is constituted by a D-FF having an asynchronous reset terminal.

Figure 3:
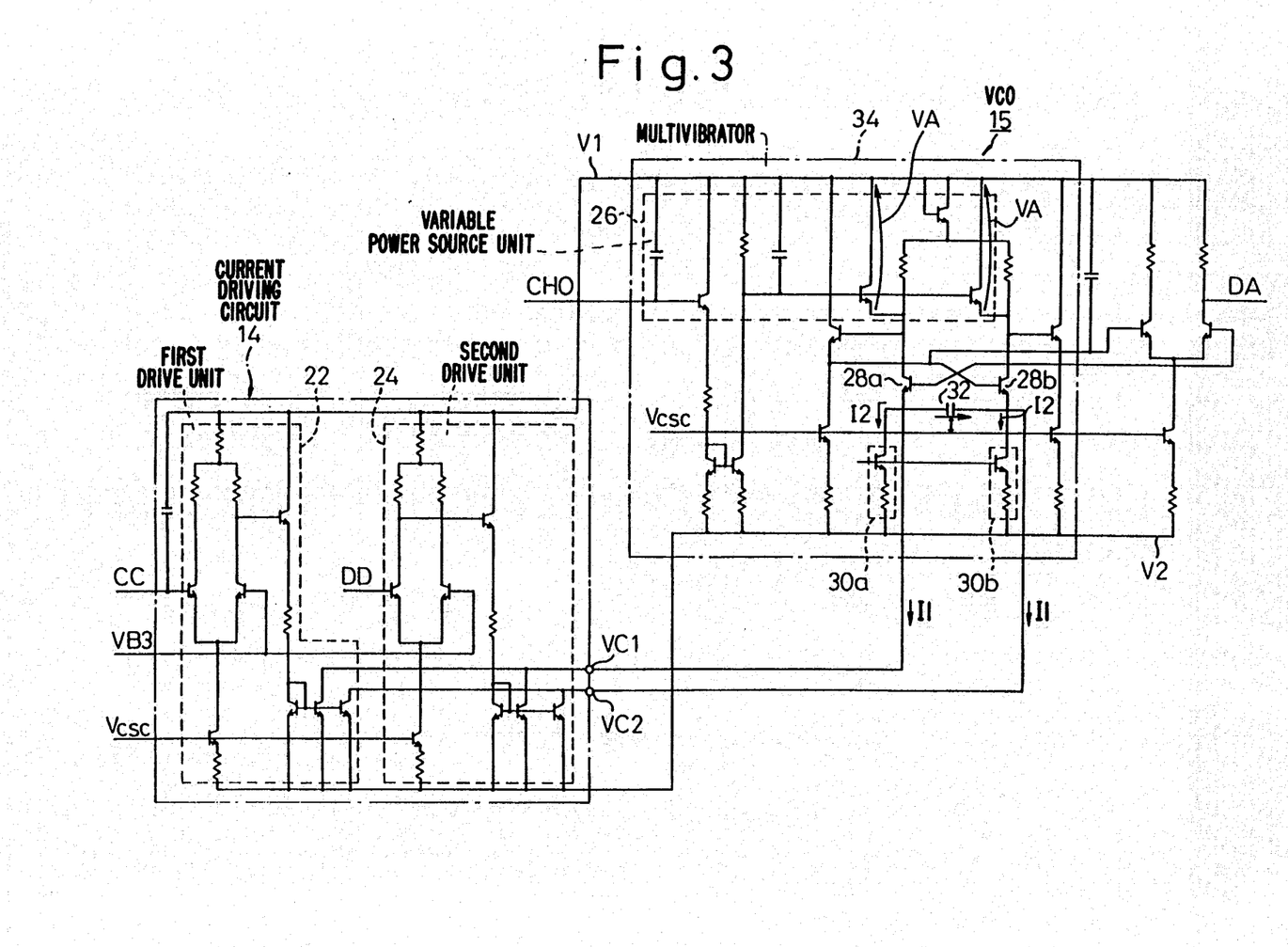
FIG. 3 is a diagram of a current drive circuit and a VCO circuit in the PLL circuit of FIG. 2.

The current drive circuit 14 is provided between the corrected pulse generating unit 12 and the VCO 15, and is constituted by a first drive unit 22 and a second drive unit 24 as shown in FIG. 3. The corrected late pulse CC and the corrected early pulse DD output from the corrected pulse generating unit 12 are input to the first drive unit 22 and to the second drive unit 24, respectively. The outputs formed in the open collectors of the first drive unit 22 and the second drive unit 24 are connected in common, and are grouped into the two output terminals VC1 and VC2 which are connected to the two terminals of a capacitor in a multivibrator that will be described later.

As shown in FIG. 3, the VCO 15 is connected to a first reference potential V1, and is constituted by a variable power source unit 26 which lowers the output voltage VA to become smaller than the present output voltage when the output voltage CHO of the charge pump unit 54 increases and raises the output voltage VA to become larger than the present output voltage when the output voltage CHO of the charge pump unit 54 decreases, and a multivibrator 34 including two transistors 28$a$ and 28$b$ which receive the output voltage VA of the variable power source 26 through the collectors thereof and of which the bases are connected to the collectors relative to each other, two constant-current sources 30$a$ and 30$b$ which are connected between the emitters of the transistors 28$a$, 28$b$ and a second reference potential V2 which is lower than a first reference potential V1, and a capacitor 32 connected between the above two emitters.

Figure 4:
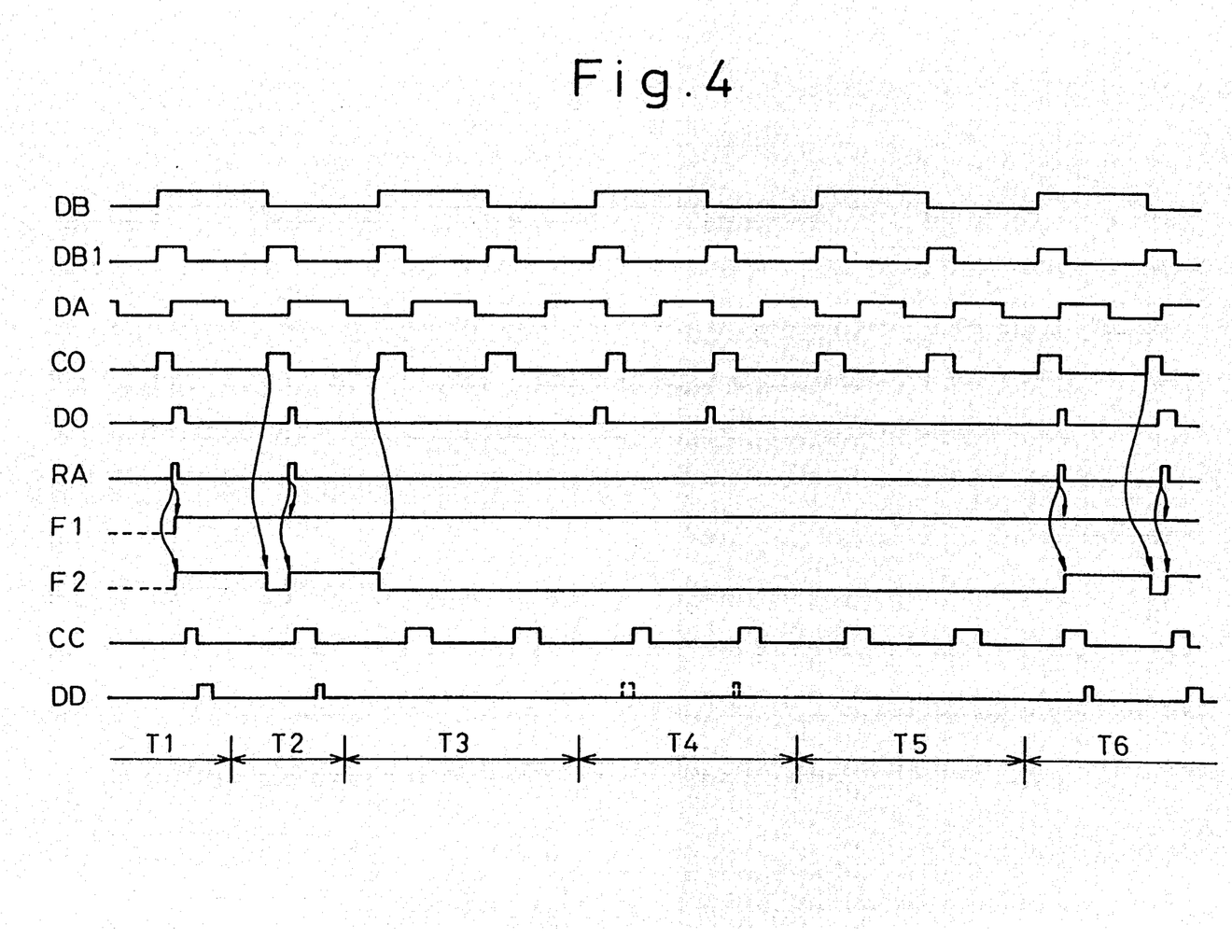
FIG. 4 is a timing chart illustrating the operation of the PLL circuit of FIG. 2.

Next, the operation of the circuit will be described with reference to FIG. 2 and to FIG. 4 which is a chart of operation timings.

First, the operation of the correction pulse generating unit 12 will be described in detail. When the oscillation frequency of the reference signal DA output from the VCO 15 suddenly decreases due to a change in the temperature, the phase of the reference signal DA begins to be delayed can pave to the phase of the external signal DB. Therefore, the phase relationship between the reference signal DA and the external signal DB shifts from a state T1 in which the phase of the reference signal DA is nearly in phase with the external signal DB (state in which the rising edge of the reference signal DA is nearly at a central position of the differentiation signal DB1) to a state T2 in which the rising edge of the reference signal DA is in the latter half portion of the differentiation signal DB1, to a state T3 in which the rising edge of the reference signal DA is outside the differentiation signal DB1, and to a state T4 in which the falling edge of the reference signal DA is within the differentiation signal DB1. In order to correct the phase of the reference signal DA which is delayed behind the phase of the external signal DB, the corrected pulse generating unit 12 outputs the corrected late pulse CC in an amount larger than that of the corrected early pulse DD to the charge pump unit 54 to increase the oscillation frequency of the VCO 15, so that the phase of the reference signal DA is brought into match with the phase of the external signal DB. When the state T3 is assumed, however, the second flag F2 is interrupted from being set again, and the corrected early pulse DD that works to lower the oscillation frequency of the VCO 15 is forcibly interrupted by the gate circuit 20. This makes it possible to quicken the operation for bringing the phase of the reference signal DA into match with the phase of the external signal DB.

When the oscillation frequency of the reference signal DA is suddenly increased, on the other hand, the first flag F1 is interrupted from being set again from when the rising edge of the reference signal DA is deviated out of the differentiation signal DB1 until when it returns again to lie within the differentiation signal DB1, the corrected late pulse DD is forcibly interrupted by the gate circuit 20, and the corrected early pulse CC only is output, in order to bring the phase of the reference signal DA into match with the phase of the external signal DB.

Next, the operation of the current drive circuit 14 will be described with reference to FIG. 3.

In the multivibrator 34 in the VCO 15, the two transistors 28a and 28b are alternatingly turned on and off to carry out the oscillation operation. The repetitive period in the oscillation operation varies depending upon the output voltage VA of the variable power source unit 26 to which the collectors of the two transistors 28a and 28b are connected and which is controlled by the output voltage CHO of the charge pump unit 54 in FIG. 2, the currents of the two constant-current sources 30a and 30b connected to both terminals of the capacitor 32, and a current drawn by the current drive circuit 14 of which the output terminals VC1 and VC2 are connected to both terminals of the capacitor 32. Here, a current drawn by the current drive circuit 14 is denoted by I1 when both the corrected late pulse CC and the corrected early pulse DD are output having an equal width, and currents of the constant-current sources 30a and 30b are denoted by I2.

First, when the corrected late pulse CC increases causing the output voltage CHO of the charge pump unit 54 to decrease, the voltage output by the variable power source unit 26 in the multivibrator 34 increases (voltage VA decreases with the first reference potential V1 as a reference). That is, a voltage applied to the collectors of the two transistors 28a and 28b connected to the variable power source 26, and a voltage at the bases of the two transistors 28a and 28b which are determining the oscillation frequency are increased. Furthermore, as the corrected late pulse CC increases, an increased current is drawn by the first drive unit 22 in the current drive circuit 14 and the corrected early pulse DD decreases. Therefore, the current drawn by the current drive circuit 14 becomes greater than the current I1.

Here, if it is presumed that the transistor 28a is turned on, a current flows through the transistor 28a, the capacitor 32, the constant-current source 30b and the current drive circuit 14, and an increased current is drawn by the current drive circuit 14. Therefore, a current that flows through the capacitor 32 becomes greater than (I1+I2), and the potential of the capacitor 32 raises at an increased rate on the side of the emitter of the transistor 28a. Therefore, the potential on the side of the base of the transistor 28b becomes lower than the potential on the side of the emitter of the transistor 28a, and the transistor 28b which had been turned off is turned on within a reduced period of time.

On the other hand, when the corrected early pulse DD increases causing the output voltage CHO of the charge pump unit 54 to increase, the voltage of the variable power source 26 decreases, the voltage drops at the bases of the two transistors 28a and 28b, and the current drawn by the current drive circuit 14 becomes smaller than the current I1. Accordingly, the potential at the base of the transistor 28a becomes lower than the potential at the emitter of the transistor 28a, and the transistor 28b which had been turned off requires an extended period of turn on time.

By adding the current drive circuit 14 as described above, the corrected late pulse CC and the corrected early pulse DD are directly converted into a current quantity that is drawn to control the oscillation operation of the multivibrator 34. Therefore, the phase of the reference signal DA can be corrected more quickly than when the oscillation operation is controlled by only the output voltage CHO which is formed by the charge pump unit 54 based upon the amount of integration of the corrected late pulse CC and the corrected early pulse DD.

Though a preferred embodiment of the invention was described above, it should be noted that the present invention is in no way limited to the above embodiment only but can be applied to a circuit of any other constitution provided the corrected pulse generating unit, the current drive circuit and the VCO contained therein operate in the same manner as mentioned in the above embodiment. It is further allowable that the VCO includes the current drive circuit or a circuit that operates in the same manner as the current drive circuit, and that the early pulse and the late pulse output from the phase comparator unit are directly input to the VCO without passing through the correction pulse generating unit.

The invention can be modified in a variety of other ways without departing from the spirit and scope of the invention, such as simply providing the corrected pulse generating unit between the phase comparator unit and the charge pump unit.

According to the PLL circuit of the present invention, the VCO is controlled by the output voltage of the charge pump unit and by the early pulse and the late pulse output from the phase comparator unit, making it possible to increase the response speed of the control loop and to decrease the amount of jittering in the reference signal with respect to the external signal. Furthermore, provision of the corrected pulse generating unit between the phase comparator unit and the charge pump unit makes it possible to delete the late pulse or the early pulse in a direction of canceling the phase control that is output from the phase comparator unit, enabling the phase of the reference signal to be quickly brought into match with the phase of the external signal. With the VCO being controlled by the output voltage of the charge pump unit and by the corrected early pulse and the corrected late pulse output from the corrected pulse generating unit, furthermore, the response speed of the control loop is quickened, the amount of jittering in the reference signal is decreased with respect to the external signal, and the signals are quickly brought into phase.

We claim:

1. A phase-locked loop (PLL) circuit which so controls the phase of a corrected reference signal that the leading edge of a reference signal is located at an intermediate position of a differentiation signal, comprising:

a phase comparator unit which accepts an external signal and a reference signal, forms, based on said external signal, a differentiation signal having a predetermined time width in synchronism with both edges thereof, outputs an early pulse only during a period in which said differentiation signal overlaps a period from the leading edge to the trailing edge of said reference signal, and outputs a late pulse only during a period in which said differentiation signal overlaps a period from the trailing edge to the leading edge of said reference signal;

a charge pump unit which accepts said early pulse and said late pulse, calculates and compares the amounts of integration of the pulses, lowers or raises the output voltage to become smaller than the present output voltage when the amount of integration of the late pulse is larger than the amount of integration of the early pulse, and raises or lowers the output voltage to become larger than the present output voltage when the amount of integration of the late pulse is smaller than the amount of integration of the early pulse; and a voltage controlled oscillator (VCO) which receives an output voltage from said charge pump unit, outputs a corrected reference signal of the frequency which is lowered to become smaller than the present frequency when the amount of integration of the late pulse is larger than the amount of integration of the early pulse and when said output voltage is raised or lowered, and outputs a corrected reference signal of the frequency which is raised to become greater than the present frequency when the amount of integration of the late pulse is smaller than the amount of integration of the early pulse and when said output voltage is lowered or raised, wherein provision is made of a corrected pulse generating unit between said phase comparator unit and said charge pump unit, said corrected pulse generating unit correcting said late pulse and said early pulse according to a phase relationship between said external signal and said reference signal, and sending a corrected late pulse and a corrected early pulse to said charge pump unit.

2. A PLL circuit according to claim 1, wherein:

said VCO is controlled by the output voltage of said charge pump unit and is further controlled by said early pulse and said late pulse output from said phase comparator unit, and works to raise the oscillation frequency to become higher than the present frequency when the width of the late pulse is larger than the width of the early pulse, and works to lower the oscillation frequency to become lower than the present frequency when the width of the late pulse is smaller than the width of the reference signal.

3. A PLL circuit according to claim 1 wherein only when said late pulse and said early pulse are input in this order in a period in which said differentiation signal is output from said phase comparator unit, said corrected pulse generating unit outputs a corrected late pulse and a corrected early pulse to said charge pump unit in the order of said late pulse and said early pulse that are input.

4. A PLL circuit according to claim 3, wherein when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output.

5. A PLL circuit according to claim 3, wherein when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit.

6. A PLL circuit according to claim 1, wherein:

when said late pulse and said early pulse are input in this order in a period in which said differentiation signal is output from said phase comparator unit, said corrected pulse generating unit outputs a corrected late pulse and a corrected early pulse to said charge pump unit in the order of said late pulse and said early pulse that are input;

when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output; and when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit.

7. A PLL circuit according to claim 1, wherein said VCO is controlled by the output voltage of said charge pump unit and is further controlled by said corrected early pulse and said corrected late pulse output from said corrected pulse generating unit, and works to raise the oscillation frequency to become higher than the present frequency when the width of the corrected late pulse is larger than the width of the corrected early pulse, and works to lower the oscillation frequency to become lower than the present frequency when the width of the corrected late pulse is smaller than the width of the corrected lead pulse.

8. A PLL circuit according to claim 7, wherein only when said late pulse and said early pulse are input in this order in a period in which said differentiation signal is output from said phase comparator unit, said corrected pulse generating unit outputs a corrected late pulse and a corrected early pulse to said charge pump unit in the order of said late pulse and said early pulse that are input.

9. A PLL circuit according to claim 8, wherein when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output.

10. A PLL circuit according to claim 8, wherein when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit.

11. A PLL circuit according to claim 7, wherein:
when said late pulse and said early pulse are input in this order in a period in which said differentiation signal is output from said phase comparator unit, said corrected pulse generating unit outputs a corrected late pulse and a corrected early pulse to said charge pump unit in the order of said late pulse and said early pulse that are input;
when the early pulse only is input, said corrected pulse generating unit outputs a corrected early pulse only to the charge pump unit until the late pulse and the early pulse are input in this order in a subsequent period in which a differentiation signal is output and when the late pulse only is input, said corrected pulse generating unit outputs a corrected late pulse only to the charge pump unit until the late pulse and the early pulse are input in this order in a subsequent period in which the differentiation signal is output; and when the early pulse and the late pulse are input in this order and when a corrected late pulse only has been output just before them, the corrected pulse generating unit outputs a corrected late pulse only to the charge pump unit and when the corrected early pulse only has been output just before them, the corrected pulse generating unit outputs a corrected early pulse only to the charge pump unit.

12. A phase-locked loop (PLL) circuit comprising:
a phase comparator unit which forms a differentiation signal based upon both edges of an external signal, outputs an early pulse only during a period in which the differentiation signal is overlapped on a period from the leading edge to the trailing edge of a reference signal, and outputs a late pulse only during a period in which the differentiation signal is overlapped on a period from the trailing edge to the leading edge thereof;
a charge pump unit which compares the amounts of integration of the early pulse and the late pulse given from said phase comparator unit, outputs a phase lead control signal when the amount of the late pulse is larger than the amount of the early pulse, and outputs a phase delay control signal when the amount of the early pulse is larger than the amount of the late pulse;
a current drive unit which controls the amount of current drawn by an output stage depending upon the early pulse and the late pulse given from said phase comparator unit, and given a predetermined draw current for the widths of the early pulse and the late pulse; and
a voltage controlled oscillator (VCO) which outputs a corrected reference signal of which the output frequency is increased by a draw current for said phase lead control signal and said late pulse given from said charge pump unit and said current drive unit, and of which the output frequency is decreased by a draw current for said phase delay control signal and said early pulse,
wherein said current drive unit controls the current drawn from an oscillation capacitance in said VCO, and the oscillation time constant is controlled by increasing the drawn current for said late pulse and decreasing the drawn current for said lead pulse.

13. A phase-locked loop (PLL) circuit comprising:
a phase comparator unit which forms a differentiation signal based upon both edges of an external signal, outputs an early pulse only during a period in which the differentiation signal is overlapped on a period from the leading edge to the trailing edge of a reference signal, and outputs a late pulse only during a period in which the differentiation signal is overlapped on a period from the trailing edge to the leading edge thereof;
a charge pump unit which compares the amounts of integration of the early pulse and the late pulse given from said phase comparator unit, outputs a phase lead control signal when the amount of the late pulse is larger than the amount of the early pulse, and outputs a phase delay control signal when the amount of the early pulse is larger than the amount of the late pulse;
a current drive unit which controls the amount of current drawn by an output stage depending upon the early pulse and the late pulse given from said phase comparator unit, and given a predetermined draw current for the widths of the early pulse and the late pulse; and a voltage controlled oscillator (VCO) which outputs a corrected reference signal of which the output frequency is increased by a draw current for said phase lead control signal and said late pulse given from said charge pump unit and said current drive unit, and of which the output frequency is decreased by a draw current for said phase delay control signal and said early pulse, wherein provision is made of a corrected pulse generating unit which corrects an early pulse and a late pulse from said phase comparator unit depending upon a phase relationship between said external signal and said reference signal, and feeds a corrected early pulse and a corrected late pulse to said charge pump unit and said current drive unit instead of feeding said early pulse and said late pulse.

14. A PLL circuit according to claim 13, wherein said corrected pulse generating unit comprises:

a set pulse circuit for generating a set pulse of a flag consisting of a logical product of said early pulse and a second late pulse that is obtained by delaying said late pulse by a predetermined period of time;

a flag circuit for forming a first flag that is set by said set pulse and is reset by said early pulse, and a second flag that is set by said set pulse and is reset by said late pulse; and a gate circuit for outputting said corrected late pulse consisting of a logical product of said first flag and said late pulse that is delayed by at least the width of the late pulse, and said corrected early pulse consisting of a logical product of said second flag and said early pulse delayed by at least the width of the early pulse.

* * * * *